(12) United States Patent  (10) Patent No.: US 7,846,821 B2
Ishiguro et al.  (45) Date of Patent: Dec. 7, 2010

(54) MULTI-ANGLE ROTATION FOR ION IMPLANTATION OF TRENCHES IN SUPERJUNCTION DEVICES

(75) Inventors: Takeshi Ishiguro, Aizuwakamatsu (JP); Hugh J. Griffin, Newtownabbey (GB); Kenji Sugiura, Kawasaki (JP)

(73) Assignee: Icemos Technology Ltd., Belfast (GB)

( * ) Notice: Subject to any disclaimer, the term of this patent is extended or adjusted under 35 U.S.C. 154(b) by 119 days.

(21) Appl. No.: 12/371,025

(22) Filed: Feb. 13, 2009

(65) Prior Publication Data

US 2009/0200634 A1    Aug. 13, 2009

Related U.S. Application Data

(60) Provisional application No. 61/028,215, filed on Feb. 13, 2008, provisional application No. 61/088,744, filed on Aug. 14, 2008.

(51) Int. Cl.
*H01L 21/425* (2006.01)
(52) U.S. Cl. .................. 438/487; 257/E21.059
(58) Field of Classification Search .......... 257/E21.248, 257/E21.059, E21.057, E21.147; 438/420, 438/487, 524
See application file for complete search history.

(56) References Cited

U.S. PATENT DOCUMENTS

| | | | |
|---|---|---|---|
| 3,404,295 A | 10/1968 | Warner, Jr. | |
| 3,497,777 A | 2/1970 | Teszner | |
| 3,564,356 A | 2/1971 | Wilson | |
| 4,158,206 A | 6/1979 | Neilson | |
| 4,211,582 A | 7/1980 | Horng et al. | |
| 4,238,278 A | 12/1980 | Antipov | |
| 4,491,486 A | 1/1985 | Iwai | |
| 4,754,310 A | 6/1988 | Coe | |
| 4,775,881 A | 10/1988 | Ploog et al. | |
| 4,821,095 A | 4/1989 | Temple | |
| 4,866,004 A | 9/1989 | Fukushima | |
| 4,868,624 A | 9/1989 | Grung et al. | |

(Continued)

FOREIGN PATENT DOCUMENTS

JP    52-038889 A    3/1977

(Continued)

OTHER PUBLICATIONS

Chenming Hu; Optimum Doping Profile for minimum Ohmic Resistance and High-Breakdown Voltage; IEEE Transactions on Electron Devices, vol. ED-26, No. 3, pp. 243-244; Mar. 1979.

(Continued)

*Primary Examiner*—Thao P. Le
(74) *Attorney, Agent, or Firm*—Panitch Schwarze Belisario & Nadel LLP

(57) ABSTRACT

A method of manufacturing a semiconductor device includes providing a semiconductor wafer and forming at least one first trench in the wafer having first and second sidewalls and a first orientation on the wafer. The first sidewall of the at least one first trench is implanted with a dopant of a first conductivity at a first implantation direction. The first sidewall of the at least one first trench is implanted with the dopant of the first conductivity at a second implantation direction. The second implantation direction is orthogonal to the first implantation direction. The first and second implantation directions are non-orthogonal to the first sidewall.

7 Claims, 10 Drawing Sheets

U.S. PATENT DOCUMENTS

| | | |
|---|---|---|
| 4,895,810 A | 1/1990 | Meyer et al. |
| 4,994,406 A | 2/1991 | Vasquez et al. |
| 5,019,522 A | 5/1991 | Meyer et al. |
| 5,027,180 A | 6/1991 | Nishizawa et al. |
| 5,045,903 A | 9/1991 | Meyer et al. |
| 5,105,243 A | 4/1992 | Nakagawa et al. |
| 5,177,027 A | 1/1993 | Lowrey et al. |
| 5,216,275 A | 6/1993 | Chen |
| 5,218,226 A | 6/1993 | Slatter et al. |
| 5,219,777 A | 6/1993 | Kang |
| 5,366,914 A | 11/1994 | Takahashi et al. |
| 5,389,815 A | 2/1995 | Takahashi |
| 5,395,790 A | 3/1995 | Lur |
| 5,418,376 A | 5/1995 | Muraoka et al. |
| 5,430,311 A | 7/1995 | Murakami et al. |
| 5,432,113 A | 7/1995 | Tani |
| 5,435,888 A | 7/1995 | Kalnitsky et al. |
| 5,438,215 A | 8/1995 | Tihanyi |
| 5,472,888 A | 12/1995 | Kinzer |
| 5,488,004 A | 1/1996 | Yang |
| 5,506,421 A | 4/1996 | Palmour |
| 5,510,287 A | 4/1996 | Chen et al. |
| 5,519,245 A | 5/1996 | Tokura et al. |
| 5,572,048 A | 11/1996 | Sugawara |
| 5,598,018 A | 1/1997 | Lidow et al. |
| 5,726,469 A | 3/1998 | Chen |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,926,713 A | 7/1999 | Hause et al. |
| 5,929,690 A | 7/1999 | Williams |
| 5,939,754 A | 8/1999 | Hoshi |
| 5,998,292 A | 12/1999 | Black et al. |
| 6,008,106 A | 12/1999 | Tu et al. |
| 6,011,298 A | 1/2000 | Blanchard |
| 6,066,878 A | 5/2000 | Neilson |
| 6,081,009 A | 6/2000 | Neilson |
| 6,172,399 B1 | 1/2001 | Lee et al. |
| 6,174,773 B1 | 1/2001 | Fujishima |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Hebert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,310,365 B1 | 10/2001 | Chen |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usui et al. |
| 6,426,991 B1 | 7/2002 | Mattson et al. |
| 6,452,230 B1 | 9/2002 | Boden, Jr. |
| 6,459,124 B1 | 10/2002 | Zhang et al. |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,512,267 B2 | 1/2003 | Kinzer et al. |
| 6,534,367 B2 | 3/2003 | Farr et al. |
| 6,566,201 B1 | 5/2003 | Blanchard |
| 6,567,717 B2 | 5/2003 | Krivokapic et al. |
| 6,613,644 B2 | 9/2003 | Lachner |
| 6,624,494 B2 | 9/2003 | Blanchard et al. |
| 6,635,906 B1 | 10/2003 | Chen |
| 6,686,244 B2 | 2/2004 | Blanchard |
| 6,710,400 B2 | 3/2004 | Blanchard |
| 6,710,403 B2 | 3/2004 | Sapp |
| 6,710,418 B1 | 3/2004 | Sapp |
| 6,713,813 B2 | 3/2004 | Marchant |
| 6,762,473 B1 | 7/2004 | Goushcha et al. |
| 6,770,559 B1 | 8/2004 | Adem et al. |
| 6,787,872 B2 | 9/2004 | Kinzer |
| 6,797,589 B2 | 9/2004 | Adams et al. |
| 6,858,854 B2 | 2/2005 | Keum et al. |
| 6,903,348 B2 | 6/2005 | Jang et al. |
| 6,936,867 B2 | 8/2005 | Chen |
| 6,936,907 B2 | 8/2005 | Chen |
| 6,998,681 B2 | 2/2006 | Chen |
| 7,015,104 B1 | 3/2006 | Blanchard |
| 7,023,069 B2 | 4/2006 | Blanchard |
| 7,041,560 B2 | 5/2006 | Hshieh |
| 7,052,982 B2 | 5/2006 | Hshieh et al. |
| 7,109,110 B2 | 9/2006 | Hshieh |
| 2002/0070418 A1 | 6/2002 | Kinzer et al. |
| 2003/0170964 A1* | 9/2003 | Kao et al. .................. 438/433 |
| 2005/0176192 A1 | 8/2005 | Hshieh |
| 2008/0105834 A1 | 5/2008 | Kim |
| 2008/0217699 A1* | 9/2008 | Disney et al. ............... 257/378 |

FOREIGN PATENT DOCUMENTS

| | | |
|---|---|---|
| WO | 2005001941 A3 | 1/2005 |
| WO | 2005031880 A1 | 4/2005 |

OTHER PUBLICATIONS

P. Rossel; Power M.O.S. Devices; Microelectron, Reliab., vol. 24, No. 2, pp. 339-366; 1984.

Victor A.K. Temple et al.; A 600-Volt MOSFET Designed for Low On-Resistance; IEEE Transactions on Electron Devices, vol. ED-27, No. 2, pp. 343-349; Feb. 1980.

Xing-Bi Chen et al.; Optimum Doping Profile of Power MOSFET; IEEE Transactions on Electron Devices, vol. ED-29, No. 6, pp. 985-987; Jun. 1982.

Fuse, Genshu et al.; "A New Isolation Method with Boron-Implanted Sidewalls for Controlling Narrow-Width Effect;" IEEE Transactions on Electron Devices, vol. ED-34, No. 2; Feb. 1987, pp. 356-360.

* cited by examiner

MULTI-ANGLE ROTATION FOR ION IMPLANTATION OF TRENCHES IN SUPERJUNCTION DEVICES

CROSS-REFERENCE TO RELATED APPLICATIONS

This application claims the benefit of U.S. Provisional Patent Application No. 61/028,215, filed on Feb. 13, 2008, entitled "Multi-Angle Rotation for Ion Implantation of Trenches in Superjunction Devices," the entire contents of which are incorporated herein. The application also claims the benefit of U.S. Provisional Patent Application No. 61/088,744, filed on Aug. 14, 2008, entitled "Multi-Angle Rotation for Ion Implantation of Trenches in Superjunction Devices," the entire contents of which are incorporated by reference herein.

BACKGROUND OF THE INVENTION

An embodiment of the present invention relates generally to a method of manufacturing a semiconductor device, and more particularly, to a method of manufacturing a superjunction device by ion implanting trenches using four different implantation directions that are generally non-orthogonal to the orientations of the trenches.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated by reference herein.

Trench type superjunction devices are expected to replace multi-epi superjunction devices because of the potential lower processing cost. FIG. 1A illustrates a top plan view of a wafer 10 used in manufacturing of a plurality of trench-type superjunction devices. A plurality of horizontally oriented trenches 12 are formed therein. FIGS. 1B and 1C are enlarged partial cross-sectional views of the wafer 10 both taken along the line A-A'. In general, a superjunction device is produced through formation of n or p columns (not shown) using adjacent sidewalls 14, 16 of the trenches 12. Doping with a dopant of n-type or p-type conductivity is performed by ion implantation at an appropriate tilt angle $\Phi$ (or $\phi'$ in FIG. 1C). The dopant impurities are thereby generally uniformly implanted at the tilt angles $\Phi, \Phi'$ throughout the sidewalls 14, 16 of each of the trenches 12.

Implantation is typically performed at a direction having a rotation angle $\theta$ that is generally orthogonal to the orientation of the trench 12. For example, in FIG. 1A, the trenches 12 have a horizontal orientation, and a first implantation direction 21 is shown in a vertical orientation, in the plane of the wafer 10, for implanting the first sidewalls 14 of the trenches 12 (see FIG. 1B). A second implantation direction 22 is also shown in a vertical orientation, opposite to the first implantation direction 21, for implanting the second sidewalls 16 of the trenches 12 (see FIG. 1C).

In certain applications, a semiconductor wafer will include two or more sets of trenches having different orientations. For example, FIG. 2 shows a wafer 11 including one set of trenches 12 having a horizontal orientation (as in FIG. 1A) and a second set of trenches 13 having a vertical orientation. For wafer 11, four implantation directions are required in order to properly dope all of the sidewalls (not shown) of all of the trenches 12, 13. For example, implantation directions 21, 22, orthogonal to the trenches 12, are used for implanting the dopant into the sidewalls of the trenches 12. Likewise, implantation directions 23, 24, orthogonal to the trenches 13, are used for implanting the sidewalls of the trenches 13.

The four angle implantation method described above is satisfactory for wafers having trenches or trench sets orthogonally aligned with one another, and the trenches each having identical doping concentrations. However, difficulties arise when the trenches are not orthogonal to one another or in situations where differing doping concentrations are required. The ion dose and/or the acceleration energy of the ion beam must be changed during processing or multiple implantation steps may be required, which increases the complexity, cost, and time for manufacturing the superjunction devices.

It is desirable to provide a method of manufacturing trench-type superjunction devices having trenches non-orthogonally aligned to one another without having to change the orientation or the ion beam strength mid-step or perform additional implantation steps. It is further desirable to provide a method of manufacturing superjunction devices wherein varying doping concentrations of different trenches may be achieved simultaneously.

BRIEF SUMMARY OF THE INVENTION

Briefly stated, various embodiments of the present invention comprise a method of manufacturing a semiconductor device. The method includes providing a semiconductor wafer and forming at least one first trench in the wafer having first and second sidewalls and a first orientation on the wafer. A dopant of a first conductivity is implanted into the first sidewall of the at least one first trench at a first implantation direction. The dopant of the first conductivity is implanted into the first sidewall of the at least one first trench at a second implantation direction. The second implantation direction is orthogonal to the first implantation direction. The first and second implantation directions are non-orthogonal to the first sidewall.

In a preferred embodiment, the method further includes implanting, with the dopant of the first conductivity, the second sidewall of the at least one first trench at a third implantation direction. The third implantation direction is orthogonal to one of the first implantation direction and the second implantation direction. The method also includes implanting, with the dopant of the first conductivity, the second sidewall of the at least one first trench at a fourth implantation direction. The fourth implantation direction is orthogonal to the third implantation direction. The third and fourth implantation directions are non-orthogonal to the second sidewall.

Embodiments of the present invention also comprise a method of manufacturing a semiconductor device. The method includes providing a semiconductor wafer and forming at least one first trench in the wafer having sidewalls and a first orientation on the wafer. At least one second trench is formed in the wafer having sidewalls and a second orientation on the wafer. The second orientation is different from the first orientation. The method further includes directing an ion implantation beam from a first implantation direction at the at least one first trench and the at least one second trench. An ion implantation beam is directed from a second implantation direction, different than the first implantation direction by 90°, at the at least one first trench and the at least one second trench. An ion implantation beam is directed from a third implantation direction, different than the first implantation direction by 180°, at the at least one first trench and the at least one second trench. An ion implantation beam is directed from a fourth implantation direction, different than the first implantation direction by 270°, at the at least one first trench and the at least one second trench. The first, second, third, and fourth implantation directions are non-orthogonal to at least one of the first orientation and the second orientation.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1A:
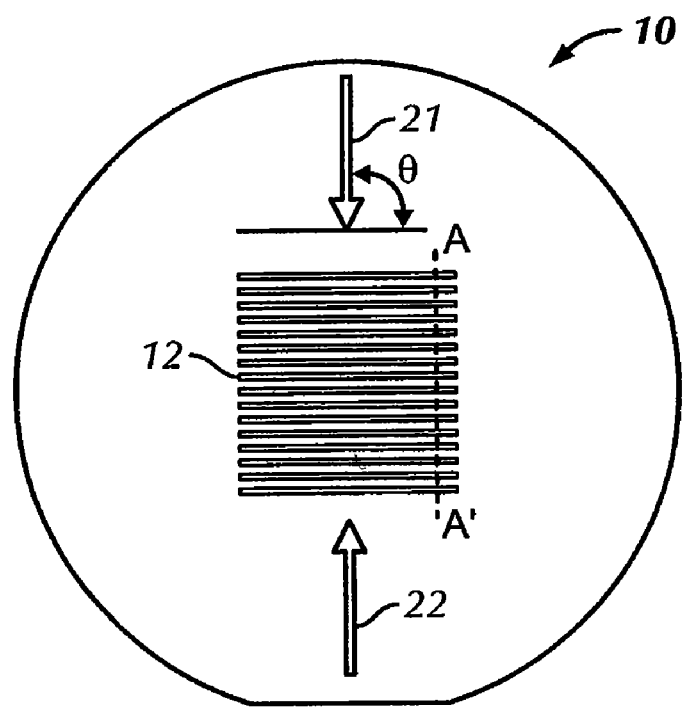
FIG. 1A is a top plan view of a prior art semiconductor wafer having a plurality of trenches formed thereon, the trenches being implanted from two implantation directions.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^-$ and $p^-$ refer to very lightly doped n and p regions, respectively. However, such relative doping terms should not be construed as limiting.

Figure 3:
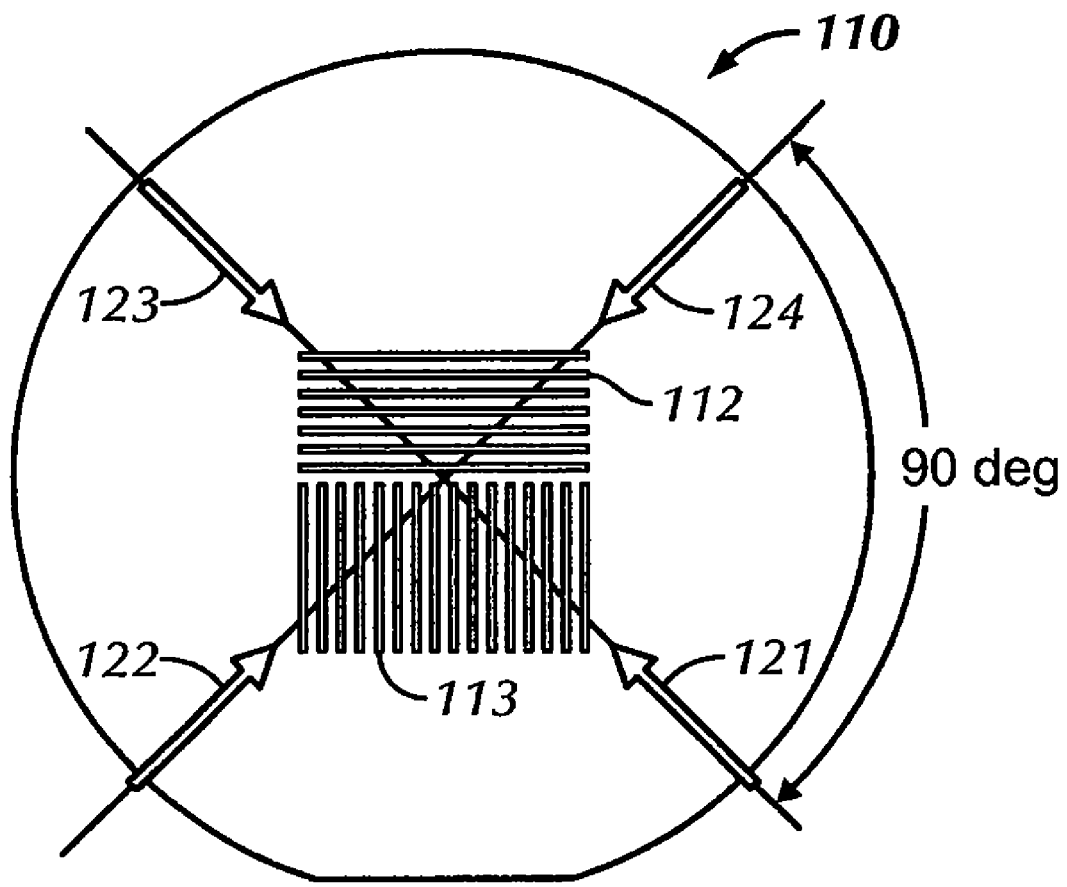
FIG. 3 is a top plan view of a semiconductor wafer having a plurality of trenches formed thereon, the trenches being implanted in accordance with a preferred embodiment of the present invention.

Referring to the drawings in detail, wherein like reference numerals indicate like elements throughout, there is shown in FIG. 3 a top plan view of a wafer 110 including a first set of trenches 112 having a first orientation direction and a second set of trenches 113 having a second orientation formed thereon. Each of the trenches 112, 113 has first and second sidewalls (not shown in FIG. 3). The first orientation shown in FIG. 3 is horizontal on the wafer 110 and the second orientation is vertical on the wafer 110. These orientations, however, are shown for illustrative purposes only, and each set of trenches 112, 113 may have any orientation on the wafer as desired.

Preferably, the trenches 112, 113 are formed by utilizing known techniques such as plasma etching, reactive ion etching (RIE), sputter etching, vapor phase etching, chemical etching, deep RIE, or the like. Utilizing deep RIE, trenches 112, 113 can be formed having depths of about 40 micrometers (μm) to about 300 μm or even deeper. Deep RIE technology permits deeper trenches 112, 113 with straighter sidewalls. Furthermore, forming deeper trenches 112, 113 that have straighter sidewalls than conventionally etched or formed trenches, in addition to other steps in the process, results in a final superjunction device with enhanced avalanche breakdown voltage ($V_b$) characteristics as compared to conventional semiconductor-transistor devices (i.e., the avalanche breakdown voltage ($V_b$) can be increased to about 200 to 1200 Volts or more).

The sidewalls of each of the trenches 112, 113 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of smoothing techniques can produce smooth trench surfaces with rounded corners while removing residual stress and unwanted contaminates.

Figure 1B:
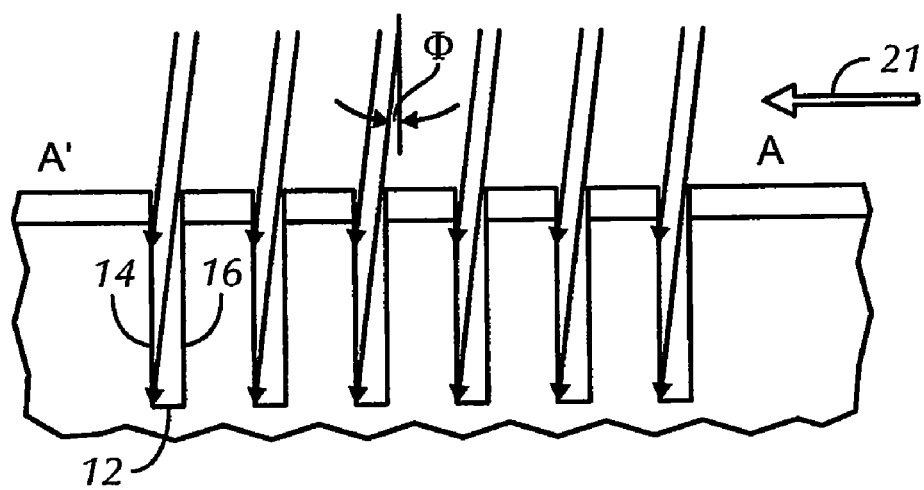
FIG. 1B is an enlarged partial cross-sectional elevational view of a portion of the wafer of FIG. 1A taken along line A-A', the trenches being implanted from a first implantation direction.
Figure 1C:
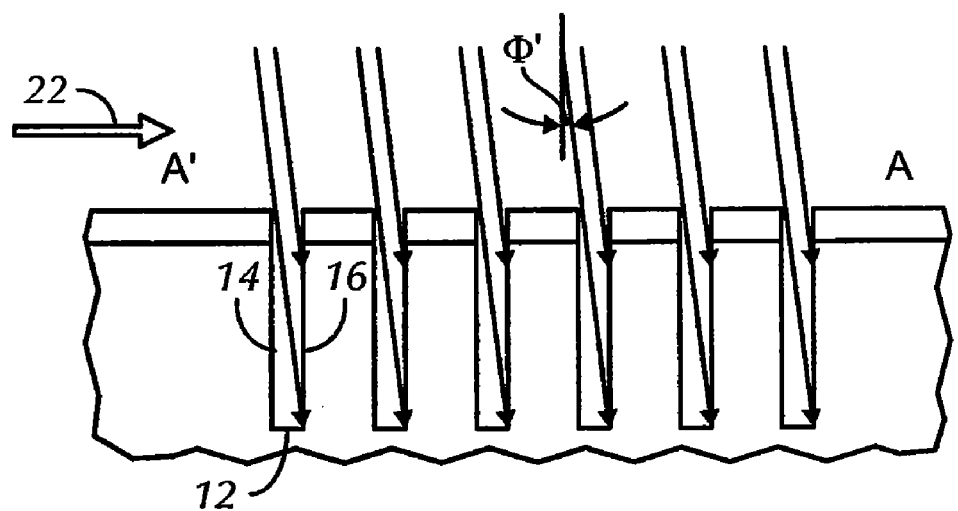
FIG. 1C is an enlarged partial cross-sectional elevational view of a portion of the wafer of FIG. 1A taken along line A-A', the trenches being implanted from a second implantation direction.
Figure 2:
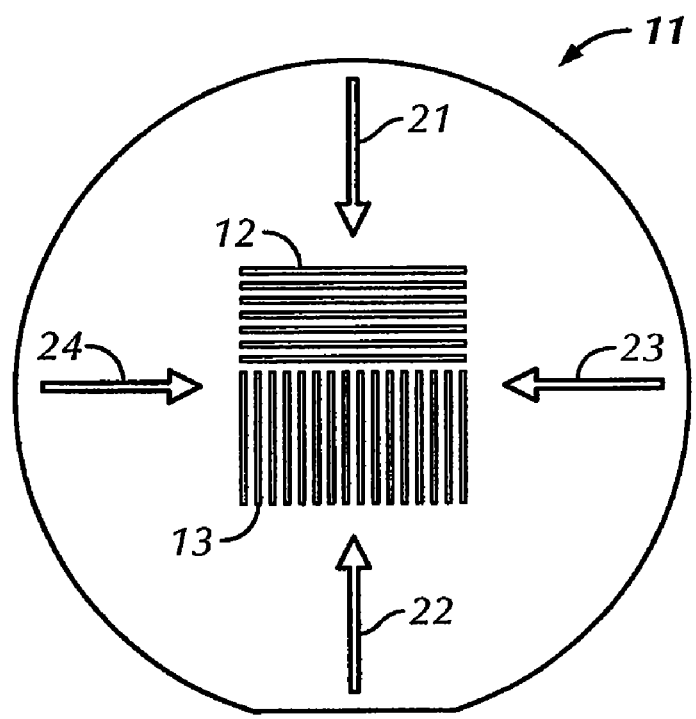
FIG. 2 is a top plan view of a prior art semiconductor wafer having a plurality of trenches formed thereon, the trenches being implanted from four implantation directions.

The sidewalls of the trenches 112, 113 are doped with a dopant of a first conductivity. Typically, the wafer 110 is comprised of an n-type semiconductor material, such as silicon or the like, and the dopant would therefore be of the p-type. For example, the sidewalls may be implanted or doped with a p-dopant such as boron (B) using any techniques known in the art. However, in some cases n-type doping may be required prior to the p-type doping of the trench sidewalls. Preferably, the implants are performed without benefits of a masking step, e.g., at a tilt angle $\Phi$ (see FIGS. 1B, 1C) determined by the width and the depth of the trenches 112, 113, at a high energy level in the range of about 40 kilo-electron-Volts (keV) to several Mega-eV (MeV). Preferably, the energy level is in the range of, for example, about 80 keV for boron and about 180 keV for phosphorous. The use of the predetermined tilt angle $\Phi$ ensures that only the sidewalls and not the bottoms of the trenches 112, 113 are implanted.

The sidewalls of the trenches 112, 113 are preferably implanted from four different directions, first implantation direction 121, second implantation direction 122, third implantation direction 123, and fourth implantation direction 124. The first, second, third, and fourth implantation directions, in the present embodiment, 121, 122, 123, 124 are generally orthogonal to one another and are non-orthogonal to at least one of, and preferably both of the first and second orientations of the respective trenches 112, 113. As shown in FIG. 3, the first, second, third, and fourth implantation directions 121, 122, 123, 124 are non-orthogonal to both the first trenches 112 and the second trenches 113.

Following implanting the p-type implant on the sidewalls of the trenches 112, 113, a drive-in step (i.e., a diffusion) is performed using any known techniques to create p-type doped regions (not shown) proximate the sidewalls of the trenches 112, 113. Preferably, a temperature and a time period for the drive-in step are selected to sufficiently drive in the implanted dopant. For example, for p-type doping, the drive-in step (i.e., a diffusion) may be performed at a temperature of about 1150-1200° Celsius for about 1-2 hours. Alternatively, for n-type doping, the drive in step may be performed at a temperature of up to about 1200° C. for up to about 24 hours.

Figure 4A:
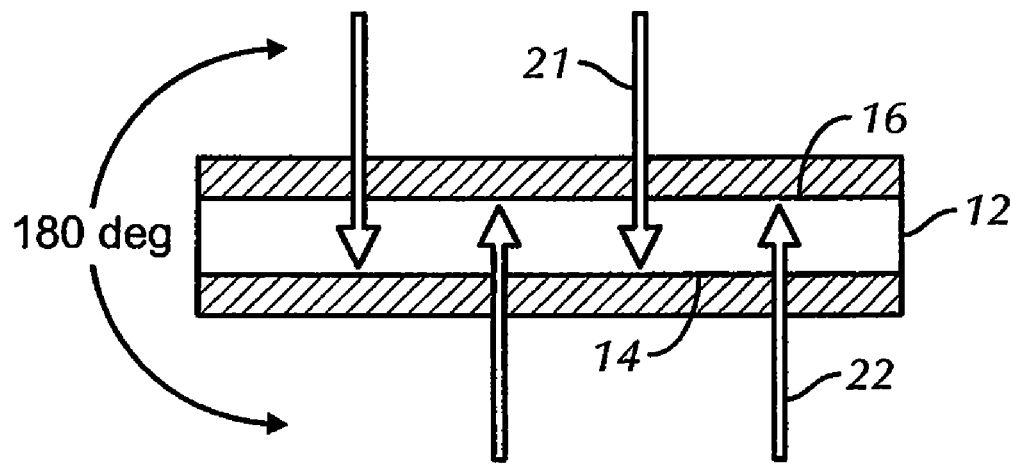
FIG. 4A is a greatly enlarged top plan view of a trench and associated sidewalls being implanted in accordance with the prior art.

FIG. 4A shows a trench implanted in accordance with prior art techniques. The trench 12 is illustrated as having a horizontal orientation. The first sidewall 14 of the trench 12 is implanted with a dopant of the first conductivity and the implantation direction 21 is orthogonal to the trench 12 orientation. Similarly, the second sidewall 16 is implanted by an orthogonally oriented implantation direction 22. Each sidewall 14, 16 thereby receives an implant dose $n_d$ during implantation.

When ion implantation is performed at a non-orthogonal rotation angle $\theta$, however, the implant dose is reduced because as the ion beam strikes the sidewall surfaces 114 or 116, the projection area is larger, thus decreasing the concentration. For example, in FIG. 4B, the ion beam A having the first implantation direction 121 strikes the first sidewall 114 of the trench 112 at an angle $\theta$ from the first sidewall 114 (and necessarily the trench orientation). The effective dose $N_{eff}$ received by the first sidewall 114 is calculated by:

$$N_{eff} = n_d \sin[\theta]$$

where $n_d$ is, as above, the implant dose of the ion beam. It is seen that for the embodiment where the implantation direction 121 is orthogonal to the first sidewall 114 (as in FIG. 4A), $\theta=90°$, and therefore $N_{eff}=n_d$.

Figure 4B:
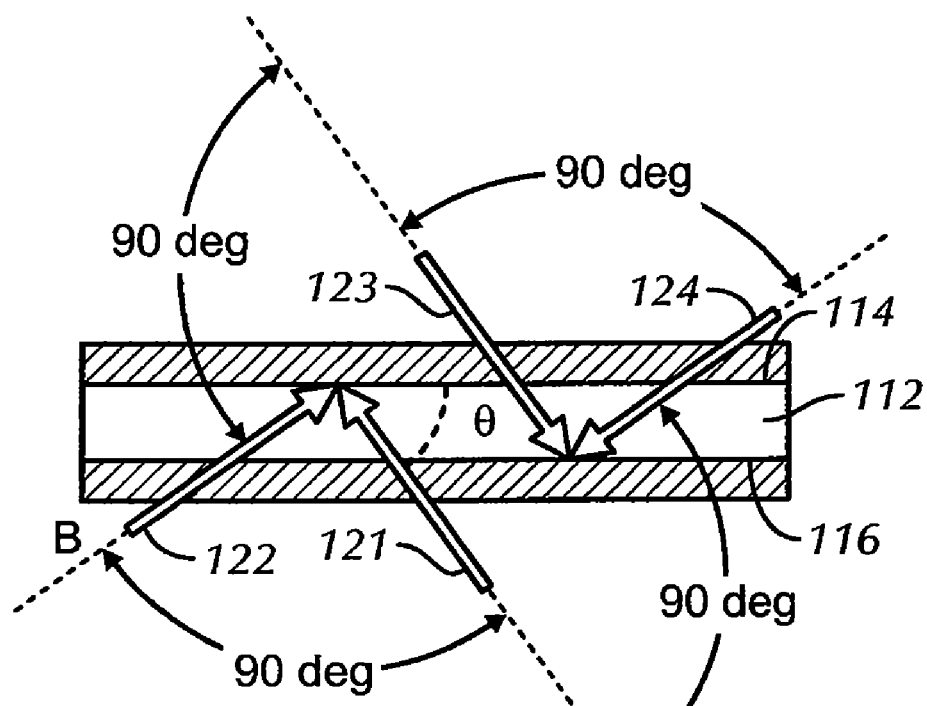
FIG. 4B is a greatly enlarged top plan view of a trench and associated sidewalls being implanted in accordance with a preferred embodiment of the present invention.

In FIG. 4B, however, two ion beams (A and B) strike the first sidewall 114 from first and second implantation directions 121, 122 respectively. The effective dose $N_{eff}$ is thus found by summing $N_{eff}$ for beam A and $N_{eff}$ for beam B. Since the second implantation direction 122 is orthogonal to the first implantation direction 121, the angle for beam B may written as $\theta+90°$, and therefore $N_{eff}$ is found simply by:

$$N_{eff} = n_d(\sin[\theta]+\cos[\theta])$$

For example, where $\theta=60°$, the effective dose for beam A is 0.87 $n_d$ and the effective dose of B is 0.5 $n_d$. Thus, $N_{eff}$ for the first sidewall 114 is 1.37 $n_d$. To achieve the desired $N_{eff}$, the required implant dose $n_d$ for both beam A and beam B is $N_{eff}/1.37$. Since each implantation direction 121, 122, 123, 124 is separated by 90°, the second sidewall 116 of the trench 112 in FIG. 4B will be doped identically to the first sidewall 114.

Figure 5A:
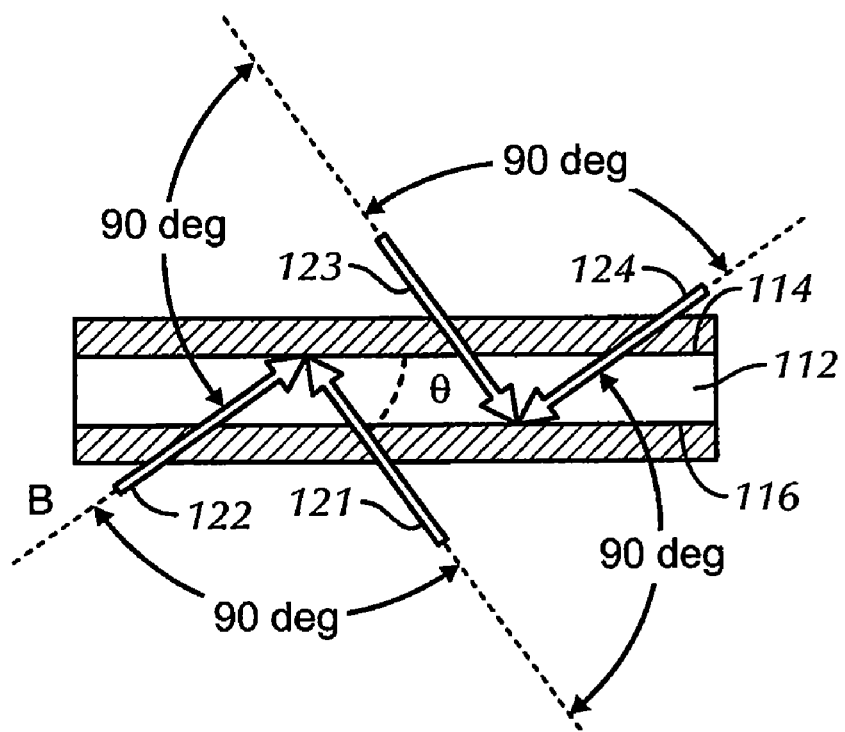
FIGS. 5A and 5B are greatly enlarged top plan views of two trenches of differing orientation and associated sidewalls being implanted in accordance with a preferred embodiment of the present invention.
Figure 5B:
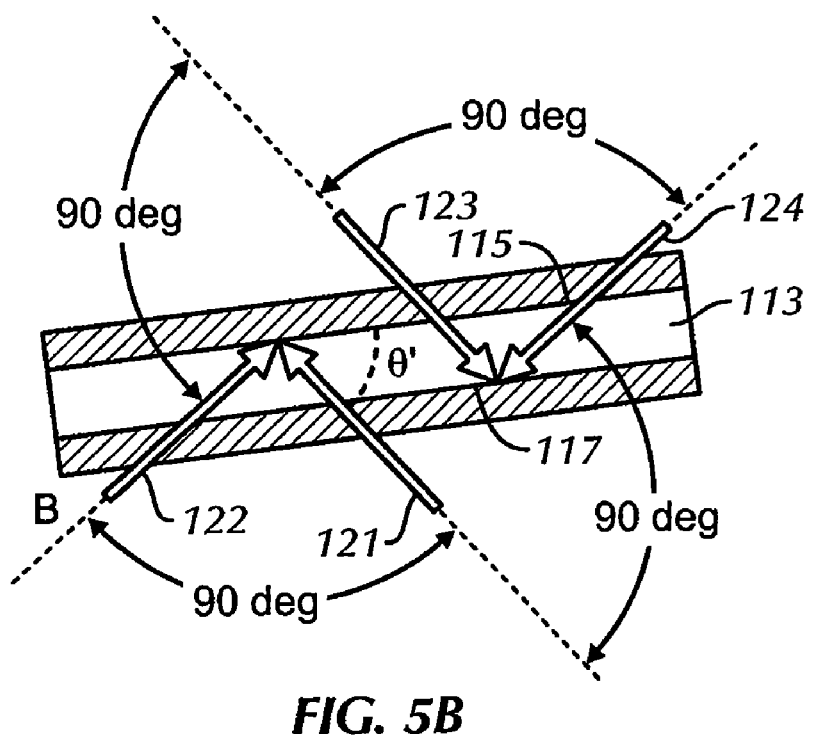

FIG. 5A shows the trench 112 of FIG. 4B adjacent to a second trench 113, shown in FIG. 5B, formed on the same wafer 110 and having first and second sidewalls 115, 117. The first, second, third, and fourth implantation directions 121, 122, 123, 124 remain the same, but the orientation of the second trench 113 is different than and non-orthogonal to the first trench 112. Although the ion beam A will be applied simultaneously to the first and second trenches 112, 113, the first ion beam A intersects the first sidewall 115 of the second trench 113 at an angle of $\theta'$ rather than $\theta$. As a result, the effective dose $N_{eff}$ for the first and second sidewalls 115, 117 of the second trench 113 must be calculated using the new $\theta'$.

Figure 6A:
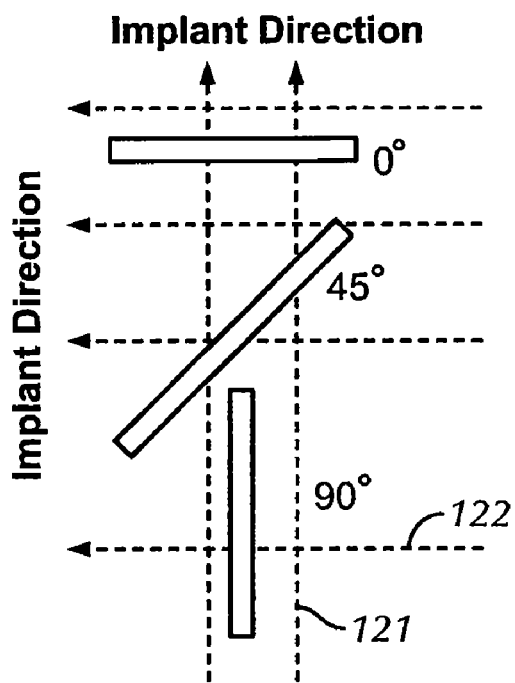
FIG. 6A is a diagram illustrating the relationship of implant direction and trench angle, in accordance with preferred embodiments of the present invention.

Under this principle, sidewall doping of the trenches 112, 113 may be tuned by altering the angle of the trench with respect to the implantation direction. For example, FIG. 6A sets parameters for a trench angle by fixing the first implantation direction 121 vertically and fixing the second implantation direction 122 horizontally. The trench angle is thus defined in relation to the second implantation direction 122, i.e., a trench collinear with the second implantation direction 122 (and orthogonal to the first implantation direction 121) is defined as having a trench angle of 0°. Similarly, a trench orthogonal to the second implantation direction 122 is defined as having a trench angle of 90°.

Figure 6B:
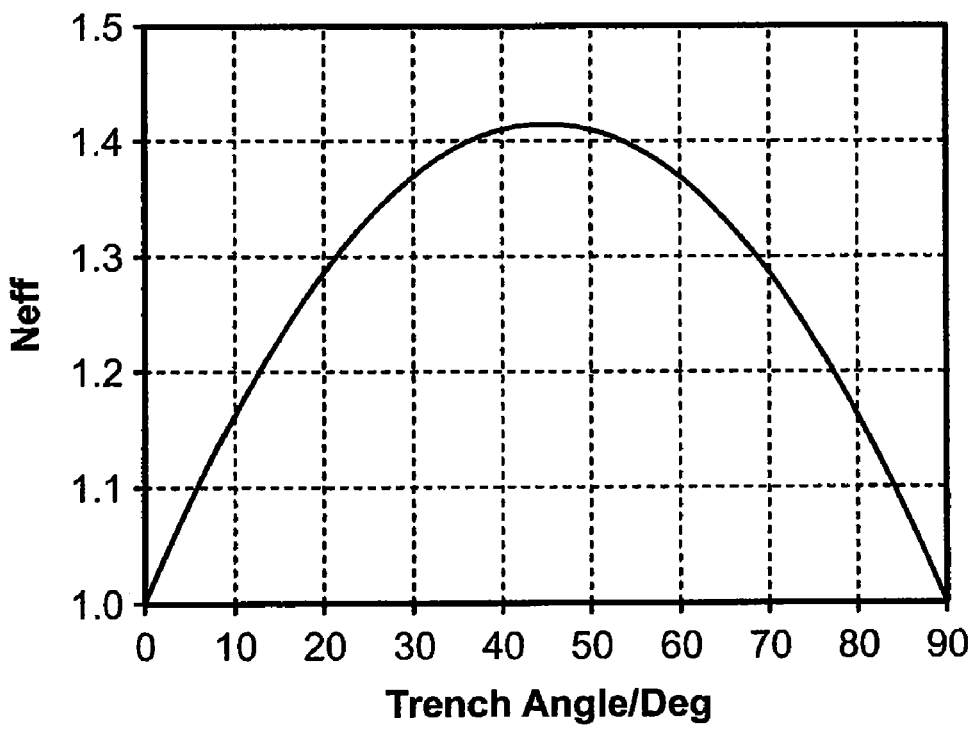
FIG. 6B is a graph illustrating the relationship between effective implantation dose and trench angle.

FIG. 6B plots the effective dose $N_{eff}$ for a trench sidewall against the trench angle (used in the above-described equation in place of $\theta$), wherein the implant dose $n_d$ is set to 1. The minimum $N_{eff}$ according to the curve is 1, found when the trench angle is 0° or 90°. The maximum $N_{eff}$ is approximately 1.41, found when the trench angle is 45°. The plot may be used for determining the trench pattern. For example, one wishing to manufacture a wafer having trenches with orientations differing by 50° and having the same doping concentration can examine the plot and find that the trench angles must be 20° and 70° to accomplish the stated objective using the method described above in accordance with preferred embodiments of the present invention. Similarly, one may use the plot to determine trench angles when it is desired to form one trench with a higher doping concentration relative to the second trench. Both results may be accomplished using a constant ion dose and acceleration energy with only four applications of the beam to the wafer 110.

Figure 7A:
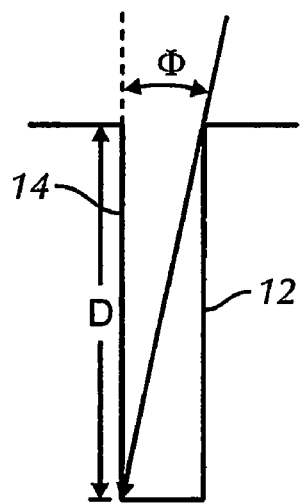
FIG. 7A is an enlarged cross-sectional side elevational view of a wafer with a trench, the trench being implanted in accordance with a prior art method.
Figure 7B:
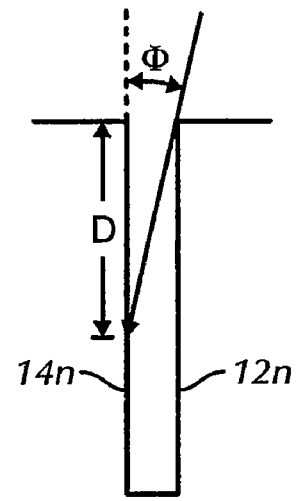
FIG. 7B is an enlarged cross-sectional side elevational view of a wafer with a relatively narrow trench, the trench being implanted in accordance with a prior art method.
Figure 7C:
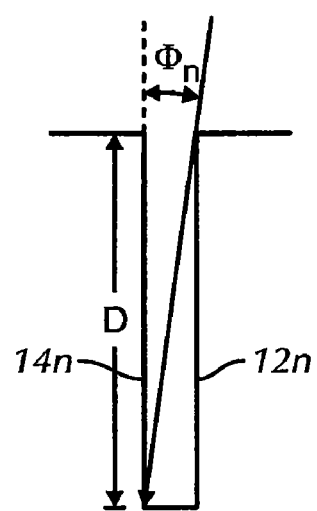
FIG. 7C is an enlarged cross-sectional side elevational view of a wafer with the trench of FIG. 7B, the trench being implanted in accordance with a prior art method.

Additional benefits of angled trench implantation are described below. For example, FIG. 7A shows that a sidewall 14 of a trench 12 implanted at tilt angle $\Phi$ is doped to a depth D when the implantation rotation angle θ is normal to the sidewall 14. In the case of a deep, narrow trench 12n (FIG. 7B), a sidewall 14n doped at the same tilt angle Φ results in a shallower doping depth D relative to the sidewall 14n. The prior art solution, shown in FIG. 7C, was to utilize a smaller tilt angle $Φ_n$. However, tilt tolerance for doping variations becomes smaller as the tilt angle is decreased, and surface ion scattering can become more severe.

The possible implantation depth D is given by the equation:

$$D = W/\tan[Φ]$$

Figure 8:
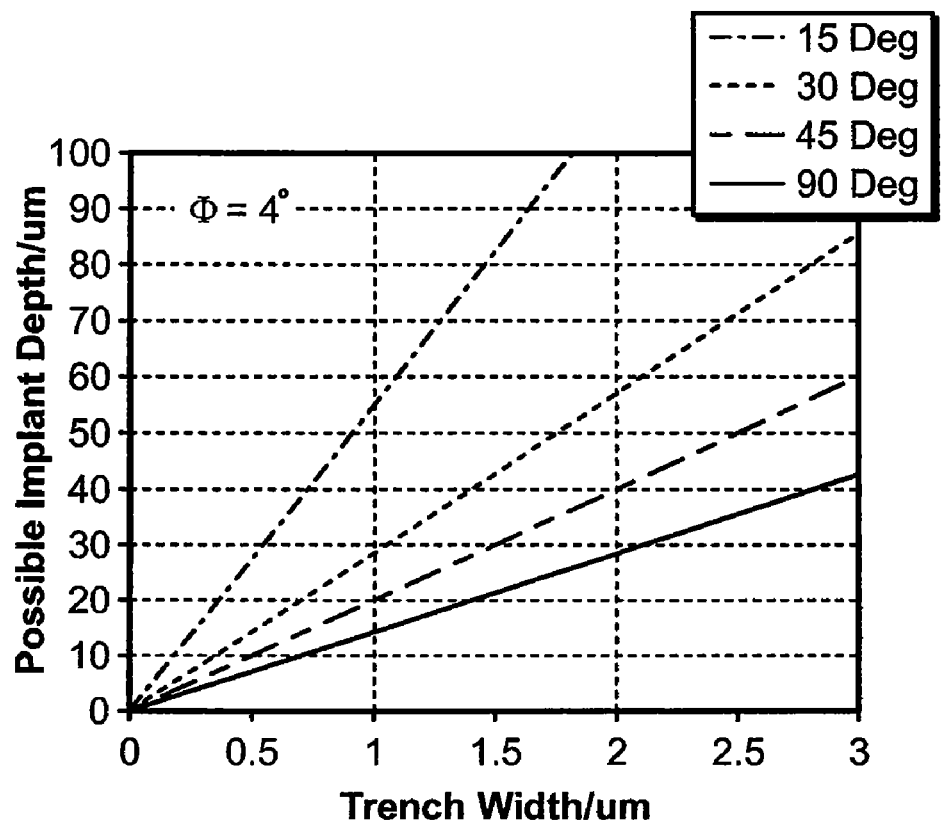
FIG. 8 is a graph illustrating the relationship between possible sidewall implantation depth and trench width for various implantation rotation angles in accordance with a preferred embodiment of the present invention.

FIG. 8 plots the possible implant depth D for a trench 112 against a width W of the trench 112 (FIG. 9A) for varying implantation rotation angles θ and with Φ=4°. It is seen that for smaller implantation rotation angles θ, the possible implantation depth D increases in accordance with preferred embodiments of the present invention. Thus, as the trench width W decreases, a small rotation angle θ can achieve the same implantation depth D without varying the tilt angle Φ. Additionally, with a smaller tilt angle Φ, very narrow and deep trenches 112 can be adequately implanted.

Figure 9A:
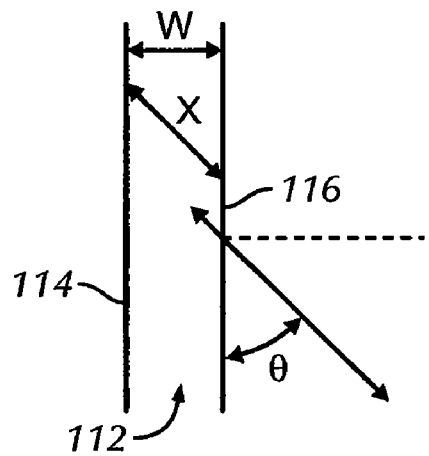
FIG. 9A is a schematic diagram illustrating the relationship between trench width, substantial trench width, and rotation angle in accordance with a preferred embodiment of the present invention.

As shown in FIG. 9A, doping the sidewall 114 at an implantation rotation angle θ appears to provide a "substantial trench width" X to the ion beam, which is greater than or equal to the actual trench width W. The substantial trench width is found by the equation:

$$X = W/\sin[θ]$$

Figure 9B:
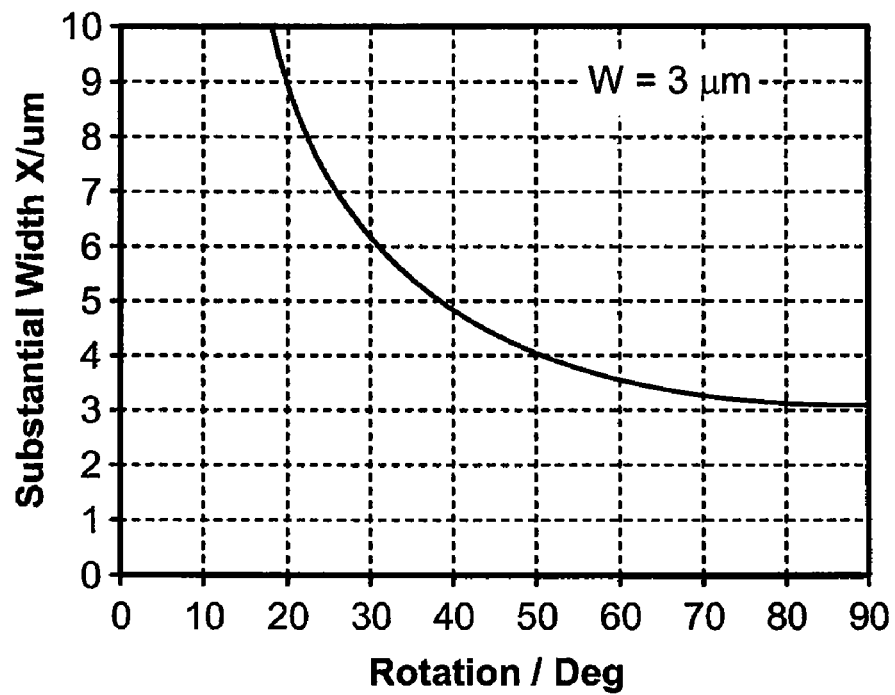
FIG. 9B is a graph illustrating the relationship between substantial trench width and implantation rotation angle.

Thus, when the implantation rotation angle θ is 90°, the substantial trench width X is equal to the actual trench width W, and as the implantation rotation angle θ approaches 0°, the substantial trench width X increases exponentially. For example, FIG. 9B plots the substantial trench width X against the rotation angle θ for W=3 µm. It is seen that for θ=45°, the substantial trench width X is about 4.24 µm.

An implantation rotation angle of 45° is therefore optimal when doping perpendicular trenches 112, 113 (e.g., as shown in FIG. 3). It is also possible to create asymmetric doping profiles, such as, for example, when the desired implant depth D for one sidewall 114 is different than the desired implant depth D for the second sidewall 116. Accordingly, one may implant the first sidewall 114 at 30° and the second sidewall 116 at 60°, for example.

Figure 10:
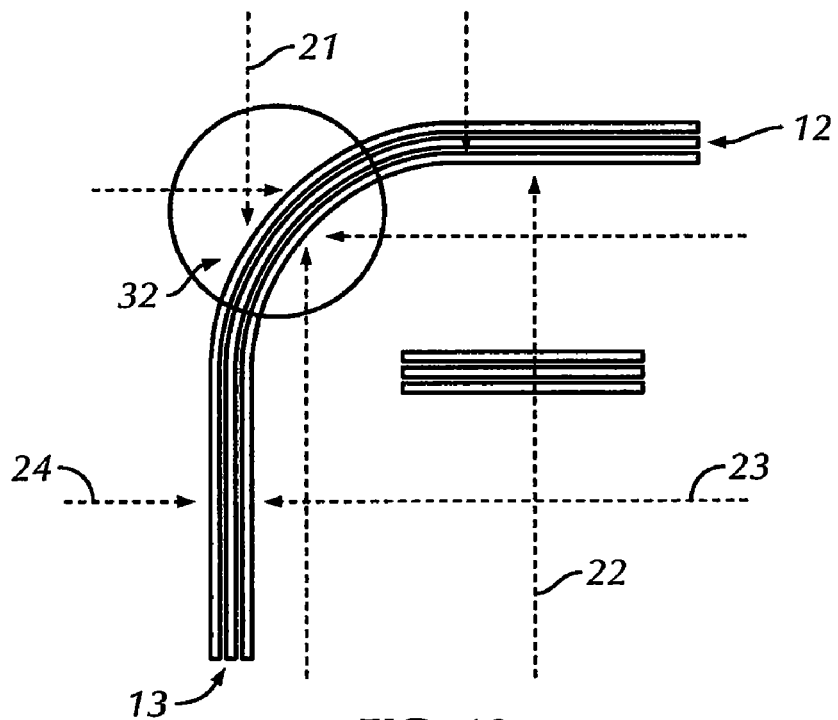
FIG. 10 is a greatly enlarged top plan view of a wafer having a corner trench being implanted in accordance with a prior art method.

Further, as shown in FIG. 10, semiconductor devices often have corners 32. The corners 32 will have different doping levels than the surrounding trenches 12, 13 because of the different trench angle with respect to the ion beam. Because the electric field is circular rather than planar, the potential exists for electrical breakdowns at the corners 32. It is therefore preferred that the doping levels of the corners 32 be lower than the doping levels of the trenches 12, 13. FIG. 10 shows that the doping level of the corners 32 will actually be higher because it receives doping from all four implantation directions 21, 22, 23, 24, while the trenches 12, 13 only receive doping from two. Using the calculations described above, the corner 32 will be doped 1.4 times higher than the trenches 12, 13, which creates a lower breakdown voltage.

Figure 11:
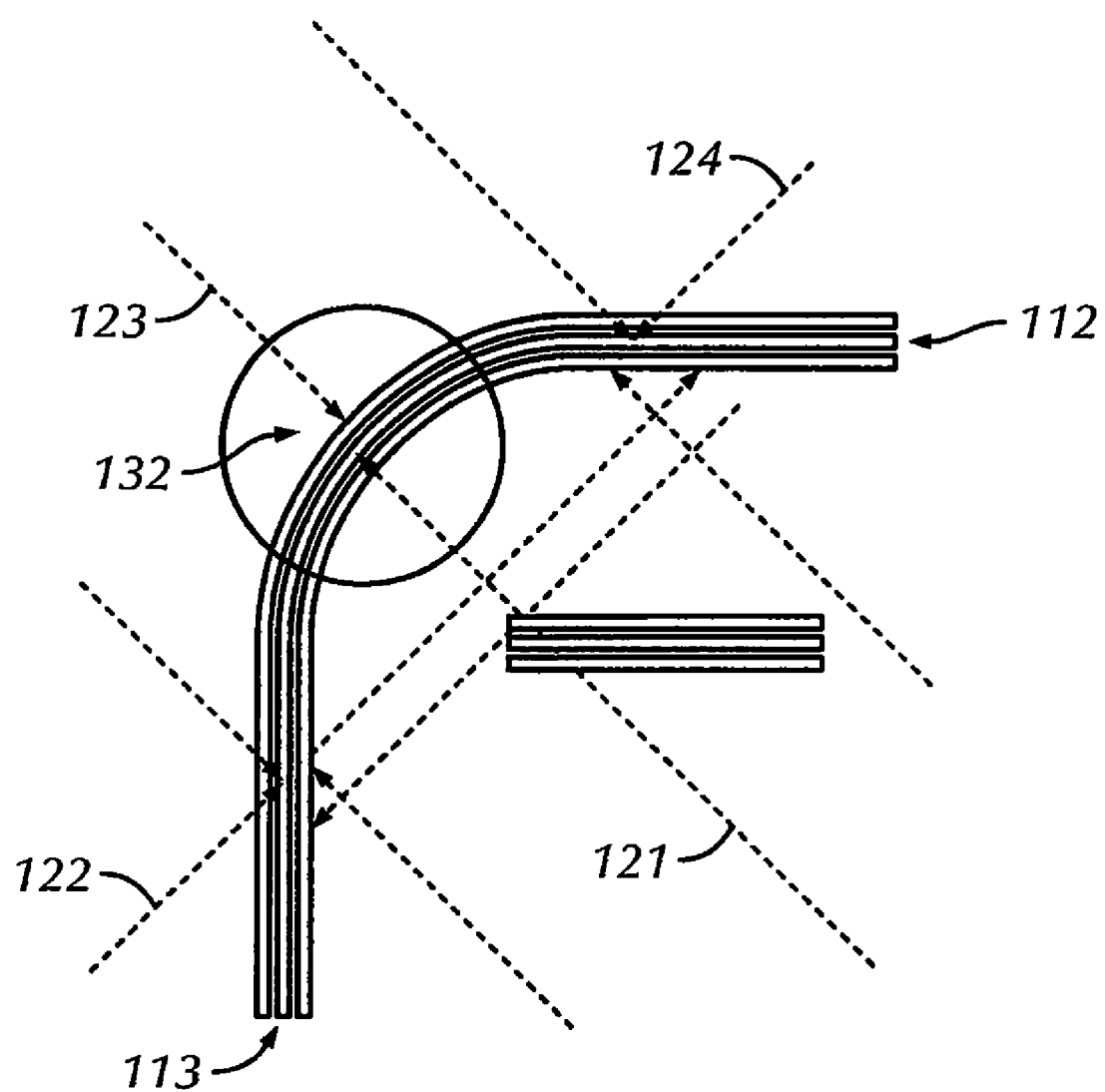
FIG. 11 is a greatly enlarged top plan view of a wafer having a corner trench being implanted in accordance with a preferred embodiment of the present invention.

FIG. 11 shows doping in accordance with preferred embodiments of the present invention. The trenches 112, 113 are doped from non-normal implantation directions 121, 122, 123, 124, preferably θ=45°, as shown in FIG. 11. The corner 132 therefore receives the lowest implant dose, which is about 0.7 times the implant dose of the trenches 112, 113. A higher breakdown with a wider doping process window is thus achieved.

It will be appreciated by those skilled in the art that the above-described multi-angle trench implantation embodiments are not confined to formation of deep trenches. The multi-angle implantation may be used in any trench fabrication requiring sidewall implant, independent of the width or depth of the trenches.

It will be appreciated by those skilled in the art that changes could be made to the embodiments described above without departing from the broad inventive concept thereof. It is understood, therefore, that the invention is not limited to the particular embodiments disclosed, but it is intended to cover modifications within the spirit and scope of the present invention as defined by the appended claims.

We claim:

1. A method of manufacturing a semiconductor device comprising:
   (a) providing a semiconductor wafer;
   (b) forming at least one first trench in the wafer, the at least one first trench having sidewalls and a first orientation on the wafer;
   (c) forming at least one second trench in the wafer, the at least one second trench having sidewalls and a second orientation on the wafer, the second orientation being different from the first orientation;
   (d) directing an ion implantation beam from a first implantation direction at the at least one first trench and the at least one second trench;
   (e) directing an ion implantation beam from a second implantation direction at the at least one first trench and the at least one second trench, the second implantation direction being different than the first implantation direction by 90°;
   (f) directing an ion implantation beam from a third implantation direction at the at least one first trench and the at least one second trench, the third implantation direction being different than the first implantation direction by 180°; and
   (g) directing an ion implantation beam from a fourth implantation direction at the at least one first trench and the at least one second trench, the fourth implantation direction being different than the first implantation direction by 270°, the first, second, third, and fourth implantation directions being non-orthogonal to at least one of the first orientation and the second orientation.

2. The method of claim 1, wherein the first orientation is orthogonal to the second orientation.

3. The method of claim 1, wherein an angle between the first orientation and the second orientation is determined by a first desired effective implantation dose of the sidewalls of the at least one first trench and a second desired effective implantation dose of the sidewalls of the at least one second trench.

4. The method of claim 1, wherein the steps (a)-(g) are performed sequentially.

5. The method of claim 1, wherein prior to commencement of each of the steps (a)-(g), the respective preceding step is substantially completed.

6. The method of claim 1, wherein prior to commencement of each of the steps (a)-(g), the respective preceding step is fully completed.

7. A semiconductor device formed by the method of claim 1.

* * * * *